(12) United States Patent
Leddige et al.

(10) Patent No.: US 7,133,962 B2
(45) Date of Patent: Nov. 7, 2006

(54) CIRCULATOR CHAIN MEMORY COMMAND AND ADDRESS BUS TOPOLOGY

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 10/658,883

(22) Filed: Sep. 9, 2003

(65) Prior Publication Data

US 2005/0055499 A1 Mar. 10, 2005

(51) Int. Cl.
*G06F 12/00* (2006.01)

(52) U.S. Cl. .................. 711/105; 711/1; 711/5; 711/100; 711/151; 711/154; 711/158; 365/230.01; 365/230.03

(58) Field of Classification Search ............ 711/5, 711/1, 100, 105, 151, 154, 158; 365/230.01, 365/230.03
See application file for complete search history.

(56) References Cited

U.S. PATENT DOCUMENTS

| | | | |
|---|---|---|---|
| 5,651,129 A | | 7/1997 | Yokote et al. |
| 5,668,834 A | * | 9/1997 | Takekuma et al. ......... 375/257 |
| 6,125,419 A | * | 9/2000 | Umemura et al. .......... 710/110 |
| 6,144,576 A | | 11/2000 | Leddige et al. |
| 6,154,821 A | * | 11/2000 | Barth et al. ................. 711/170 |
| 6,446,174 B1 | * | 9/2002 | Dow .......................... 711/154 |
| 6,477,614 B1 | | 11/2002 | Leddige et al. |
| 6,788,548 B1 | * | 9/2004 | Dobler et al. ............... 361/777 |
| 6,842,864 B1 | * | 1/2005 | Barth et al. ................. 713/401 |
| 6,934,785 B1 | * | 8/2005 | Lee et al. .................... 710/300 |
| 2005/0033905 A1 | * | 2/2005 | Leddige et al. ................ 711/5 |

OTHER PUBLICATIONS

International Search Report, Mar. 16, 2005, 4 pages, PCT/US2004/029056.
Crisp R, "Applicatin for Rambus Interface Technology" Rambus Information, XP-002163003, pp. 1-6. Feb. 10, 1998.

* cited by examiner

*Primary Examiner*—Stephen C. Elmore
(74) *Attorney, Agent, or Firm*—Blakely, Sokoloff, Taylor & Zafman LLP

(57) ABSTRACT

Embodiments of the invention provide a memory command and address (CA) bus architecture that can accommodate higher CA data output frequencies with reduced signal degradation. For one embodiment of the invention the CA signal is routed to a first of two dual in-line memory modules (DIMMs) of a two-DIMM/channel memory bus design. The CA signal is then divided into components, with each CA signal component routed serially through a group of dynamic random access memory (DRAM) chips on the first DIMM. The CA signal components are then recombined and routed to the second DIMM. The recombined CA signal is then divided again into components, with each CA signal component routed serially through a group of dynamic random access memory (DRAM) chips on the first DIMM and the CA signal components are then recombined. In one embodiment, after routing through each DRAM, the CA signal is terminated on the DIMM.

30 Claims, 3 Drawing Sheets

CIRCULATOR CHAIN MEMORY COMMAND AND ADDRESS BUS TOPOLOGY

FIELD

Embodiments of the invention relate generally to the field of digital processing system memory architecture and more particularly to memory command and address bus topology.

BACKGROUND

Typical memory architectures have several drawbacks that limit their performance. This is due to the increasing data output frequencies for dynamic random access memory (DRAM). Synchronous DRAM (SDRAM) delivers data at high speed by using, among other things, an interface synchronized to the processor's internal clock. Therefore SDRAM has an output data frequency equal to the clock frequency. Double data rate (DDR) SDRAM provides data even faster by outputting data on the rising and falling edge of the clock, thus having an output data frequency of twice the clock frequency. For both SDRAM and DDR, the clock frequency is synchronous with the core frequency. For DDR II, the I/O buffers are clocked at twice the core frequency thereby providing an even greater output data frequency.

As the output data frequency increases, the signal integrity decreases. FIG. 1 illustrates a typical memory architecture in accordance with the prior art. Memory architecture 100, shown in FIG. 1, includes chipset 105. The chipset (core logic) 105 includes a memory controller 106 that controls the data flow between the system processor (not shown) and the system memory. The system memory may be contained on one or more dual in-line memory modules (DIMMs) 110. In such architecture, the command and address (CA) signals are propagated from the memory controller 106 along CA bus 108 to each DIMM 110. CA bus 108 may have, for example, eight parallel lines to propagate CA signals to the DRAM. On the board the CA signal is divided and routed to each DIMM. On each DIMM, the CA signals are successively divided to route to each DRAM over traces 109 as shown in FIG. 1. This successive division results in proportionately reduced CA signal components reaching each DRAM. Because the lengths of traces 109 are basically matched, the electrical delay to any DRAM is approximately the same. Therefore each reduced CA signal component hits the load of the respective DRAM at the same time substantially degrading each CA signal component. Additionally, the electrical reflection resulting from the trace pattern may result in interference. The extent of this interference depending upon the signal strength, and the ratio between the actual signal and the reflection.

The prior art architecture illustrated in FIG. 1 is acceptable at lower frequencies (e.g., 200 Mhz). However, as frequencies increase and the signal length becomes proportional to the physical length of the traces, the signal degradation becomes unacceptable.

The signal degradation described above has been addressed in several ways including changing the circuitry (e.g., additional resistors, duplicated lines (extra pins), etc.) and buffering the DIMM (adding extra logic chips to reduce the loading on the CA busses). These methods are costly as they amount to significant departures to industry standards for particular designs.

Another prior art memory architecture, direct Rambus™ DRAM (DRDRAM), increases data output frequency through use of a 16-bit bus (rather than the DRAM's 8-bit bus), and data pipelining. DRDRAM addresses the lumped load problem through a sequential routing scheme, but because the signal is routed through 32 DRAM chips, the signal strength eventually degrades. Additionally, the direct DRDRAM routing is across one DIMM to a connector on the motherboard and across the next DIMM, finally terminating on the motherboard, which requires additional pins at the connector. Moreover, routing through additional connectors causes signal degradation due to electrical reflection from the connectors as described above.

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide a memory CA bus architecture that can accommodate higher CA data output frequencies with reduced signal degradation. For one embodiment of the invention the CA signal is routed to a centrally located DRAM on a first DIMM of a multi-DIMM/channel memory bus design. At this point the CA signal is divided and a CA signal component is routed to a group of DRAMs on one portion of the DIMM while other CA signal components are routed to other groups of DRAMS on the first DIMM. The CA signal components are then routed sequentially through each DRAM of a group of DRAMs on the respective portions of the first DIMM. The CA signal components are then recombined and transmitted to a second DIMM. The process is continued until the CA signal has been routed to all DIMMs of the multi DIMM memory bus design. In one embodiment, after routing through the last DIMM, the CA signal is terminated at a termination point on the last DIMM. In an alternative embodiment, the CA signal is terminated on the motherboard after routing through the last group of DRAMs and recombining on the last DIMM.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
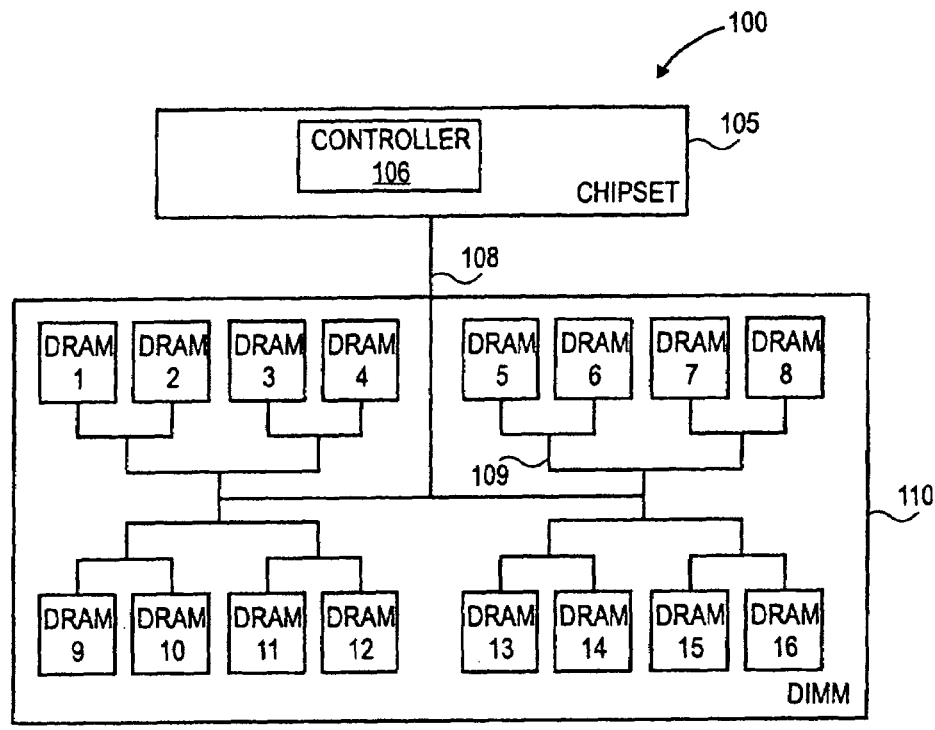
FIG. 1 illustrates a typical memory architecture in accordance with the prior art.
Figure 2:
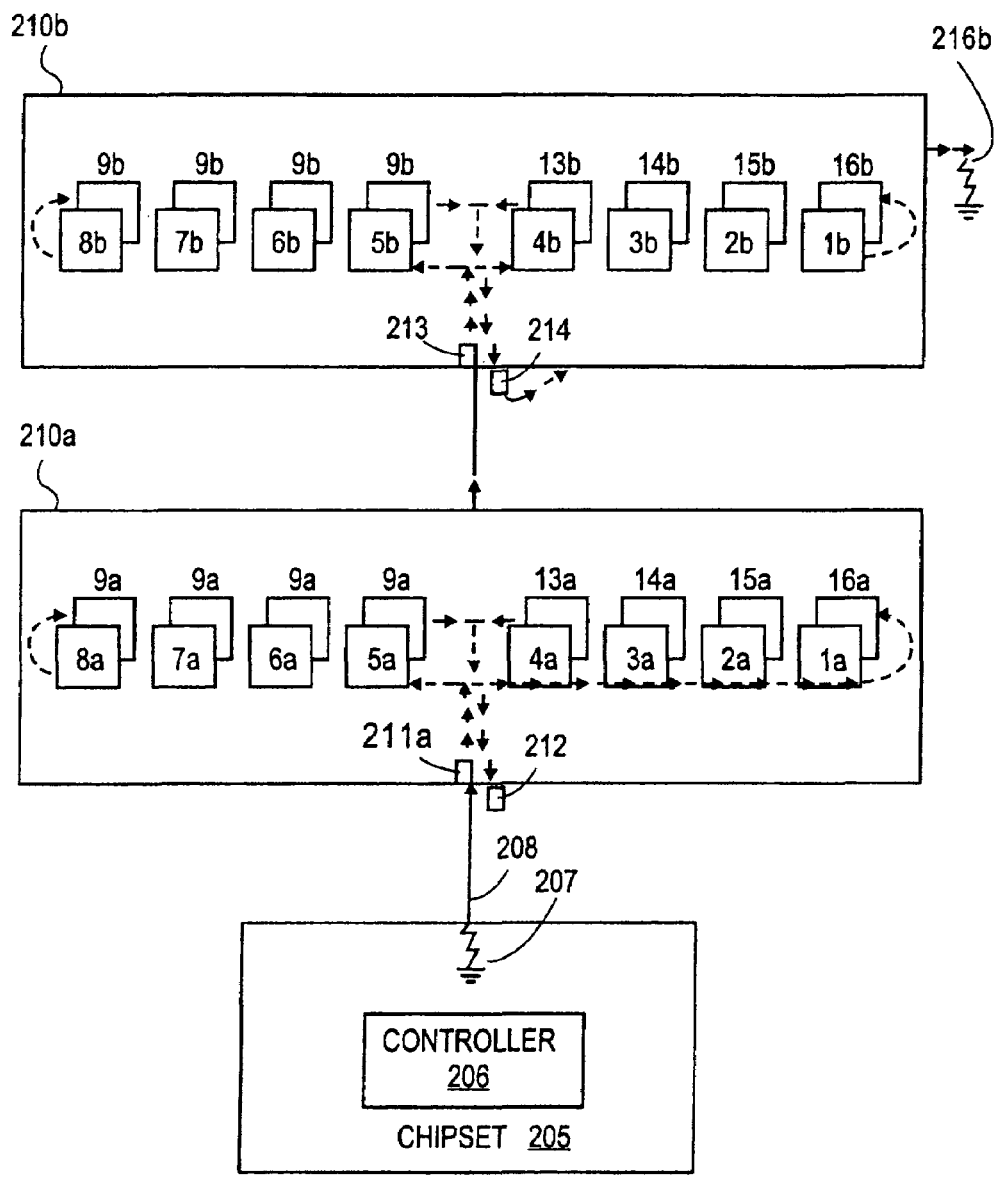
FIG. 2 illustrates a memory CA bus architecture in accordance with one embodiment of the present invention.

FIG. 2 illustrates a memory CA bus architecture in accordance with one embodiment of the present invention. Memory architecture 200, shown in FIG. 2, includes a chipset 205 coupled to DIMM 210a and DIMM 210b by a CA bus 208. The chipset 205 includes memory controller 206. During operation, the CA signal is routed to a central location DIMM 210a. FIG. 2 illustrates routing to a centrally located point between DRAM between DRAMs 1a–16a. In FIG. 2 the routing is to a point between DRAM 4a and DRAM 5a, however routing may be other points in alternative embodiments. On the motherboard, the CA signal is propagated from driver pin 207 on chipset 205 to connector pin 211a on DIMM 210a. At this point the CA signal is divided into two components. The first CA signal component is propagated through DRAMs 5a–12a on DIMM 210a starting with DRAM 5a. The first CA signal component is not further divided on DIMM 210a, but is propagated through each of DRAMs 5a–12a, one DRAM at a time. Therefore the load through which the signal propagates is a distributed load rather than a "lumped" load, as in prior art schemes. The second CA component is propagated through DRAMs 4a–1a, and DRAMs 16a–13a, as shown. The first CA component and the second CA component are then recombined and routed through connector 212 to connector 213, centrally located on DIMM 210b. The CA signal is then divided with a first CA signal component routed through DRAMs 5b–12b and a second CA signal component routed through DRAMs 4b–1b and 16b–13b. The CA signal components are then recombined. Upon propagation through each of the DRAMs on DIMM 210b, the signal terminates at termination point 216b on the motherboard (not shown). In alternative embodiments the termination point may be on DIMM 210b after the two CA signal components are recombined.

The load distribution through serial propagation of the CA signal components may require added logic. For example, added logic may be required to track the clock domain crossing due to the delay (time difference) between propagation of the signal through the first DRAM and the last DRAM (on each DIMM). For one embodiment, such added logic may be implemented on the chipset. In alternative embodiments the added logic may be implemented on the DRAM itself, or on both the chipset and the DRAM.

Impedance

As discussed above, mismatched impedance along the CA bus may result in reflections that degrade the CA signal. The CA bus topology in accordance with one embodiment of the invention, simplifies the routing of the CA signal across the DIMM as well as across the motherboard resulting in reduced signal reflection. Additionally, the CA bus topology in accordance with one embodiment of the invention provides greater flexibility for matching impedances. For one embodiment, the DRAM impedance and Bloch mode impedance for a given bandwidth is matched to the on-DIMM impedance which is greater than or equal to the mother board impedance. The chipset driver impedance is matched to the motherboard impedance and the DIMM termination point impedance is matched to the on-DIMM impedance.

The most significant parasitics are the interconnect resistance and interconnect (ground and coupling) capacitance, as well as substrate cross-talk. Interconnect parasitics are becoming the more significant concern, especially with multiple metal interconnect layers.

The CA bus architecture in accordance with one embodiment of the invention takes advantage of the small DRAM capacitive silicon loading and package to adjust the PCB routing to match a Bloch mode impedance across a given bandwidth as described above.

An estimate of DDRIII scaled parasitics would hit an on-DIMM impedance of approximately 50–60 Ohms and a motherboard impedance of approximately 25–50 Ohms. A data rate bandwidth in excess of 800 MT/s can be achieved with substantially the specifications of DDRII.

Figure 3:
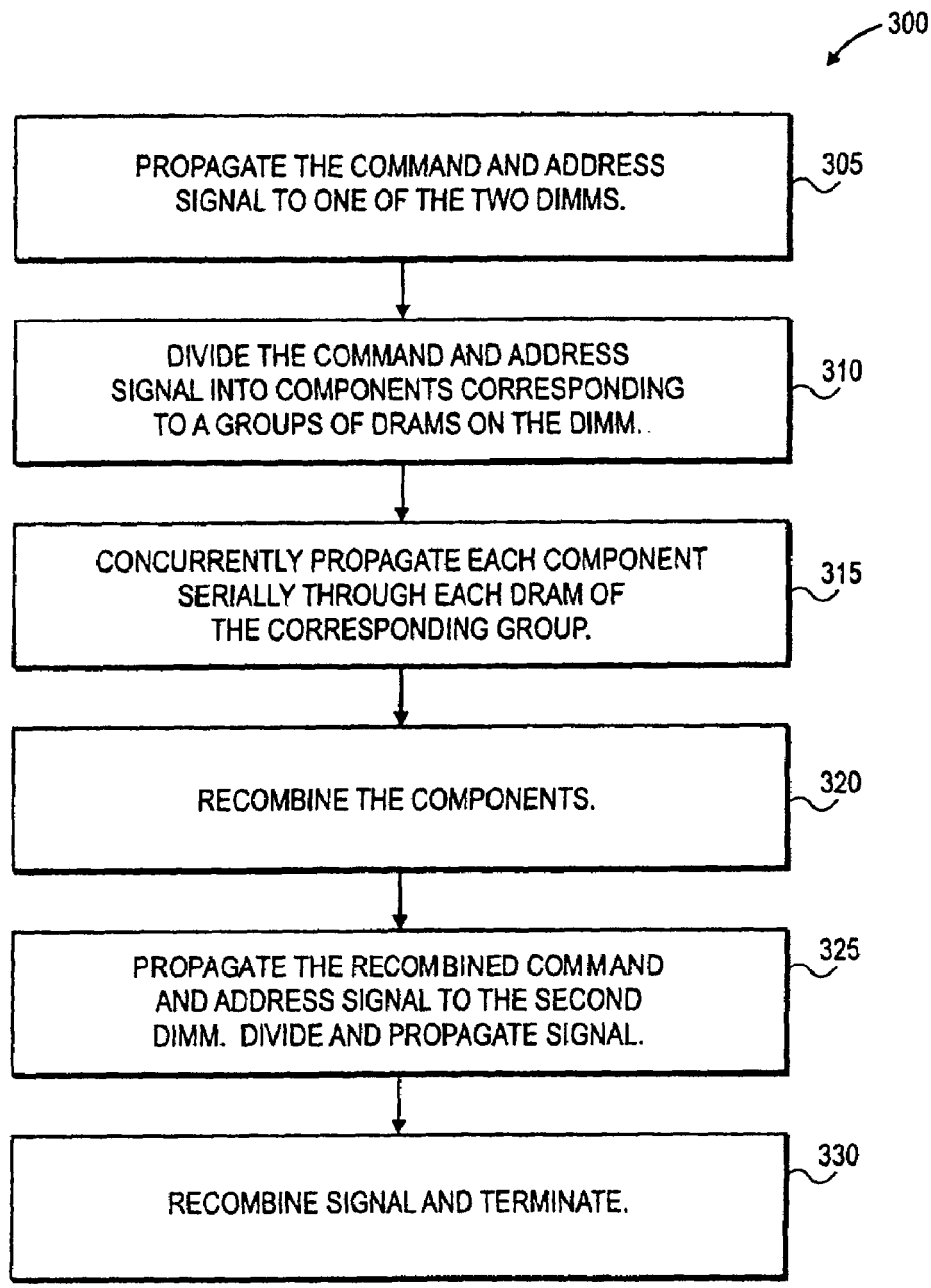
FIG. 3 illustrates a process in which CA signals are propagated from the memory controller to the system memory in accordance with one embodiment of the invention.

FIG. 3 illustrates a process in which CA signals are propagated from the memory controller to the system memory in accordance with one embodiment of the invention. Process 300, shown in FIG. 3, begins at operation 305 in which a CA signal is propagated from the memory controller to the first of two DIMMs of a two-DIMM/channel memory bus design. Alternative embodiments apply to a multi-DIMM/channel memory bus design having more than two DIMMs.

At operation 310 the CA signal is divided into two or more components depending upon the number of groups of DRAMs on the DIMM through which a CA signal component will be propagated, and each component is propagated to a respective group of DRAMs on the DIMM.

At operation 315 the CA signal components for each group of DRAMs are concurrently propagated to each DRAM of the respective group. Each CA signal component is propagated serially, through the group, starting with a specified DRAM of the group.

At operation 320 each of the two or more CA signal components are recombined.

At operation 325, the recombined CA signal is propagated to the second DIMM. The signal is again divided and a CA signal component is propagated through each group of DRAMs on the second DIMM as described above in reference to operations 310 and 315.

At operation 330, each of the two or more CA signal components is recombined and the recombined CA signal is terminated on the motherboard. In an alternative embodiment of the invention, the CA signal component may be terminated on the second DIMM upon recombination.

General Matters

Embodiments of the invention provide a CA bus architecture suited for a two DIMM/channel memory bus design common in Desktop and Mobile platforms. In alternative embodiments, the CA bus architecture may be applied to other memory bus designs. The CA bus architecture in accordance with one embodiment, increases CA bandwidth without a significant departure from existing industry standards. For one embodiment, the pin count is minimized and with only a slight increase in logic complexity.

For one embodiment, the channel design is optimized to take advantage of the unidirectional bus CA DRAM parasitics to improve the channel bandwidth by a factor of eight over prior art CA topology schemes.

For one embodiment of the invention the on-Dimm routing and motherboard routing is simplified providing the flexibility to adjust the impedances to provide optimized voltage swing and minimal reflections, and thus higher performance.

In reference to FIG. 2, the order of propagation of each CA signal component is described as initially proceeding through all of the DRAMs of each group on the front side of DIMM 210a (e.g., DRAMs 4a–1a) and then continuing through all of the DRAMs for the group on the back side of DIMM 210a (i.e., DRAMs 16a–13a). In alternative embodiments, the propagation of the CA signal component may instead alternate from a front-side DRAM to a back-side DRAM of each group, or vice versa. For example, the propagation of the CA signal component may start at DRAM 1a, proceed to DRAM 16a, and alternate from front-side DRAMs to back-side DRAMs, finally reaching DRAM 13a to be recombined with the other CA signal component.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A memory system architecture comprising:
   a memory controller;
   a plurality of memory modules, each memory module containing a plurality of memory chips;
   a command and address bus coupling the memory controller to each of the plurality of memory modules such that a command and address signal propagated from the memory controller to one of the memory chips is propagated serially to each of the plurality of memory modules, the command and address signal divided into two or more components at each memory module, each component corresponding to a group of memory chips of a respective memory module, each component propagated serially to each of the memory chips of the corresponding group of memory chips.

2. The memory system architecture of claim 1 wherein the two or more components of the command and address signal are recombined after propagation through each of the memory chips of the respective memory module prior to propagation to a subsequent memory module of the plurality of memory modules.

3. The memory system architecture of claim 2 wherein the command and address signal is terminated upon propagation through each memory chip of each of the plurality of memory modules.

4. The memory system architecture of claim 3 wherein the plurality of memory modules comprises two memory modules and the plurality of memory chips comprises sixteen memory chips.

5. The memory system architecture of claim 4 wherein the command and address signal is terminated at a signal termination point on a final memory module after propagating serially through each of the plurality of memory modules.

6. The memory system architecture of claim 4 wherein a first impedance between a connector on the chipset and a connector on the first memory module is less than a second impedance through a memory module.

7. The memory system architecture of claim 6 wherein the second impedance is the same, within a specified tolerance, as a third impedance through the plurality of memory chips plus a Bloch mode impedance corresponding to a specified data output frequency.

8. The memory system architecture of claim 7 wherein a chipset driver impedance is the same, within a specified tolerance, as the first impedance and an impedance of the signal termination point is the same, within a specified tolerance, as the second impedance.

9. The memory system architecture of claim 2 wherein the command and address bus is a unidirectional address bus.

10. The memory system architecture of claim 1 wherein each memory module is a dual in-line memory module and each memory chip is a dynamic random access memory chip.

11. A method comprising:
    propagating a command and address signal from a chipset over a command and address bus to one of a plurality of memory modules, each memory module containing two or more groups of memory devices;
    dividing the command and address signal into a plurality of components, each component corresponding to a group of memory devices of a respective memory module;
    propagating each component serially, to each of the memory devices of the corresponding group of memory devices.

12. The method of claim 11 further comprising:
    recombining the plurality of components of the command and address signal after propagation through each of the memory devices of the corresponding group of memory devices; and
    propagating the recombined command and address signal to a subsequent memory module of the plurality of memory modules.

13. The method of claim 12 wherein the command and address signal is terminated upon propagation through each memory device of each of the plurality of memory modules.

14. The method of claim 12 wherein the command and address bus is a unidirectional address bus.

15. The method of claim 11 wherein each memory module is a dual in-line memory module and each memory device is a dynamic random access memory device.

16. The method of claim 11 wherein the plurality of memory modules comprises two memory modules and the plurality of memory devices comprises sixteen memory devices.

17. The method of claim 16 further comprising:
    terminating the command and address signal at a signal termination point on a final memory module after propagating serially through each of the plurality of memory modules.

18. The method of claim 16 wherein a first impedance between a connector on the chipset and a connector on the first memory module is less than a second impedance through a memory module.

19. The method of claim 18 wherein the second impedance is the same, within a specified tolerance, as a third impedance through the plurality of memory devices plus a Bloch mode impedance corresponding to a specified data output frequency.

20. The method of claim 19 wherein a chipset driver impedance is the same, within a specified tolerance, as the first impedance and an impedance of the signal termination point is the same, within a specified tolerance, as the second impedance.

21. A system comprising:
    a processor;
    a memory controller coupled to the processor;
    a command and address bus coupled to the memory controller, the command and address bus configured to propagate a command and address signal to one of a plurality of memory modules, divide the command and address signal into a plurality of components, each component corresponding to a particular group of memory devices of a plurality of memory devices contained on the memory module, and propagate each component serially to each of the memory devices of the corresponding group of memory devices.

22. The memory system architecture of claim 21 wherein the plurality of components of the command and address signal are recombined after propagation through each of the memory devices of the memory module prior to propagation to a subsequent memory module of the plurality of memory modules.

23. The memory system architecture of claim 22 wherein the command and address signal is terminated upon propagation through each memory device of each of the plurality of memory modules.

24. The system of claim 21 wherein each memory module is a dual in-line memory module and each memory device is a dynamic random access memory device.

25. The system of claim 21 wherein the command and address bus is a unidirectional address bus.

26. The system of claim 21 wherein the plurality of memory modules comprises two memory modules and the plurality of memory devices comprises sixteen memory devices.

27. The system of claim 26 further comprising:
terminating the command and address signal at a signal termination point on a final memory module after propagating serially through each of the plurality of memory modules.

28. The system of claim 26 wherein a first impedance between a connector on the memory controller and a connector on the first memory module is less than a second impedance through a memory module.

29. The system of claim 28 wherein the second impedance is the same, within a specified tolerance, as a third impedance through the plurality of memory devices plus a Bloch mode impedance corresponding to a specified data output frequency.

30. The system of claim 29 wherein a memory controller driver impedance is the same, within a specified tolerance, as the first impedance and an impedance of the signal termination point is the same, within a specified tolerance, as the second impedance.

* * * * *